(12) United States Patent
Landolt

(10) Patent No.: US 11,187,726 B2
(45) Date of Patent: Nov. 30, 2021

(54) OSCILLOSCOPE AND METHOD FOR OPERATING AN OSCILLOSCOPE

(71) Applicant: Rohde & Schwarz GmbH & Co. KG, Munich (DE)

(72) Inventor: Oliver Landolt, Taufkirchen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 120 days.

(21) Appl. No.: 15/915,994

(22) Filed: Mar. 8, 2018

(65) Prior Publication Data

US 2019/0277886 A1 Sep. 12, 2019

(51) Int. Cl.
*G01R 13/02* (2006.01)
(52) U.S. Cl.
CPC ..... *G01R 13/0254* (2013.01); *G01R 13/0272* (2013.01)
(58) Field of Classification Search
None
See application file for complete search history.

(56) References Cited

U.S. PATENT DOCUMENTS

| 6,269,317 | B1* | 7/2001 | Schachner | G01R 35/002 324/94 |
| 6,836,738 | B2 | 12/2004 | Sepp et al. | |
| 7,437,624 | B2 | 10/2008 | Miller et al. | |
| 2006/0080065 | A1* | 4/2006 | Pupalaikis | G01R 13/0272 702/189 |
| 2012/0041720 | A1* | 2/2012 | Pupalaikis | G01R 13/0272 702/189 |
| 2012/0076187 | A1* | 3/2012 | Dobyns | G01R 13/0236 375/224 |
| 2012/0095713 | A1* | 4/2012 | Pickerd | G01R 13/0272 702/104 |

\* cited by examiner

*Primary Examiner* — Nasima Monsur
(74) *Attorney, Agent, or Firm* — Christensen O'Connor Johnson Kindness PLLC

(57) ABSTRACT

An oscilloscope comprises a processing module or circuit and at least a first channel and a second channel. The first channel comprises a digitizer configured to receive an analog input signal and to provide a time and amplitude discrete representation of the input signal to the processing module. The second channel comprises a phase digitizer configured to receive a reference signal and to provide a time discrete representation of the phase of the reference signal to the processing module. The processing module is configured to process both the time and amplitude discrete representation of the input signal and the time discrete representation of the face of the reference signal.

20 Claims, 3 Drawing Sheets

OSCILLOSCOPE AND METHOD FOR OPERATING AN OSCILLOSCOPE

TECHNICAL FIELD

Embodiments of the present disclosure relate generally to an oscilloscope as well as a method for operating an oscilloscope.

BACKGROUND

In the analysis of certain signals it can prove useful to analyze the signal with respect to a phase of a reference signal rather than the reference signal itself.

In the state of the art, such analysis is usually done via post-processing of stored waveform samples by software-based methods, which is inherently slow.

Therefore, there is a need for an oscilloscope as well as a method for operating an oscilloscope that is capable of fast analysis of an input signal with respect to the phase of a reference signal.

SUMMARY

Embodiments of the present disclosure provide an oscilloscope. The oscilloscope comprises a processing module and at least a first channel and a second channel. The first channel comprises a digitizer unit, the digitizer unit being configured to receive an analog input signal and to provide a time and amplitude discrete representation of the input signal to the processing module. The second channel comprises a phase digitizer unit, the phase digitizer unit being configured to receive a reference signal and to provide a time discrete representation of the phase of the reference signal to the processing module. The processing module is configured to process both the time and amplitude discrete representation of the input signal and the time discrete representation of the phase of the reference signal. In some embodiments, the reference signal is periodic. Moreover, the digitizer unit may be configured to digitize the analog input signal in order to provide the time and amplitude discrete representation of the input signal.

With the proposed oscilloscope, analysis of an analog input signal with respect to the phase of a reference signal is done hardware-based (e.g., analog circuits, digital circuits or a combination of analog and digital circuits), which is typically orders of magnitude faster than software-based solutions. In other words, the phase of the reference signal is extracted on-the-fly (in real time) with hardware-based methods without a need for slow software-based post-processing of stored waveform samples, and therefore in a particularly fast manner.

According to an aspect, the processing module is configured to analyze relations between the time and amplitude discrete representation of the input signal and the time discrete representation of the phase of the reference signal. This type of analysis is particularly useful for debugging of synchronous logics or for analyzing serial data streams. As the analysis is done hardware-based, it can be performed in a fast manner, in particular on-the-fly and in real time.

According to another aspect, the processing module comprises a trigger unit being configured to generate a trigger signal based on at least one of a first trigger condition applied to the time and amplitude discrete representation and a second trigger condition applied to the time discrete representation of the phase of the reference signal. In other words, the trigger unit is configured to detect certain events in at least one of the signals. In particular, the trigger unit is configured to detect certain events defined by a momentary value of both the time and amplitude discrete representation of the input signal and the time discrete representation of the phase of the reference signal. This kind of trigger conditions is especially useful for debugging synchronous logic. The trigger unit may be configured to provide the trigger signal to other elements of the oscilloscope, e.g. to a display unit, a signal processing unit or a memory unit.

In one embodiment, the processing module is configured to detect whether the momentary pair of values lies within a predetermined value range, the pair of values being defined by a value of the time and amplitudes discrete representation of the input signal and an assigned value of the time discrete representation of the phase of the reference signal. The predetermined value range is a two-dimensional manifold (sometimes also referred to as "eye" of an eye diagram) in a plane where one axis represents the phase of the reference signal and another axis represents an amplitude of the analog input signal. The manifold may have any shape, e.g. the shape of a slotted rectangle, a slotted ellipse or an annulus. However, deformations of these shapes are also possible. The momentary pair of values lying outside of the predetermined value range could also be used as a trigger condition, which will in the following be referred to as eye diagram violation. According to the present disclosure, eye diagram violations are observed on-the-fly, i.e. without the need of software-based post-processing. Therefore, eye diagram violations can be observed orders of magnitude faster than in the state of the art.

In another embodiment, the processing module is configured to determine a statistical frequency that the momentary pair of values lies within the predetermined value range or not. In particular, the processing module is configured to determine the statistical frequency of the momentary pair of values lying outside of the predetermined value range. Put another way, the processing module determines a number of eye diagram violations. The statistical frequency of eye diagram violations may be outputted to further components of the oscilloscope, e.g. a display unit or a memory unit.

According to a further aspect, the processing module is configured to determine the statistical frequency between at least one of two predetermined portions of the time discrete representation of the phase of the reference signal and two predetermined portions of the time and amplitude discrete representation of the input signal. In particular, a statistical frequency of eye diagram violations within a certain phase interval is determined. The predetermined portions may be defined by certain trigger conditions imposed on at least one of the time discrete representation of the phase of the reference signal and the time amplitude discrete representation of the input signal.

In a certain embodiment, the processing module comprises a display unit being configured to display pairs of values being defined by a value of the time and amplitude discrete representation of the input signal and an assigned value of the time discrete representation of the phase of the reference signal. In particular, the display unit is configured to plot the time and amplitude discrete representation of the input signal versus the time discrete representation of the phase of the reference signal, which essentially results in an eye diagram. Therefore, a visual representation of the input signal with respect to the phase of the reference signal is generated on-the-fly without software-based post-processing of stored data. The display unit may be configured to generate a histogram of the pairs of values.

In another embodiment, the phase digitizer unit comprises a phase accumulator unit being configured to provide the time discrete representation of the phase of the reference signal. In particular, the phase accumulator unit is configured as a digital oscillator providing a time discrete phase of a periodic clock signal (i.e. the time discrete representation of the phase of the reference signal) to the processing module instead of the periodic clock signal itself.

According to one aspect, the phase digitizer unit comprises a phase increment unit being configured to add a phase increment to the reference signal. More precisely, the phase increment unit adds the phase increment to the time discrete representation of the reference signal which may be stored in the phase accumulator unit. Thus, the time discrete representation of the reference signal is successively updated and provided to the processing module.

According to another aspect, the phase increment unit is configured to add the phase increment at several cycles of the reference signal.

The phase increment unit may be configured to vary the phase increment. The phase increment may be varied by a constant factor or may be matched to a certain reference signal. Put another way, the phase increment is varied to provide a time discrete phase of a periodic clock (i.e. the time discrete representative of the phase of the reference signal) with a desired frequency. For example, the frequency of the reference signal may be multiplied by a constant factor to generate the desired frequency of the periodic clock signal.

According to one embodiment, the phase digitizer unit further comprises a phase locking unit being configured to adjust the phase increment based on a control signal, for example via a phase-locked loop (PLL). In particular, the phase locking unit is configured to adjust the frequency of the time discrete representation of the reference signal to the frequency of the control signal. This is particularly useful in the analysis of serial data streams, as the frequency of time discrete representation of the reference signal can be adjusted to match the frequency of the serial data stream modulation on-the-fly, i.e., particularly fast.

The control signal may be provided by at least one of an analog input channel, a mixed-signal channel, an external trigger input and a line trigger reference.

According to another aspect, the reference signal comprises at least one of an analog input signal, and external trigger input, a logic analyzer input, a sampling clock signal and a recovered clock signal from a serial data stream.

Embodiments of the present disclosure also provide a method for operating an oscilloscope. The method comprises the following steps:

receiving an analog input signal and a reference signal;

digitizing the analog input signal to provide a time and amplitude discrete representation of the input signal;

processing the reference signal to provide a time discrete representation of the phase of the reference signal; and analyzing relations between the time and amplitude discrete representation of the input signal and the time discrete representation of the phase of the reference signal.

The reference signal may comprise at least one of an analog input signal, an external trigger input, a logic analyzer input, a sampling clock signal and a recovered clock signal from a serial data stream. With respect to the advantages, reference is made to the explanations given above.

In a certain embodiment, the analyzing of the time discrete representation of the phase of the reference signal and the time and amplitude discrete representation of the input signal is done hardware-based. Therefore, the method according to the present disclosure may be orders of magnitude faster than previously known software-based methods. Accordingly, there is no need for computational intensive and comparatively slow software-based post-processing of stored waveform data.

According to an aspect, the phase increment is added to the time discrete representation of the phase of the reference signal in several cycles of the reference signal. In particular, the phase increment can be varied, e.g. scaled with a constant factor or matched to a control signal.

The phase increment may be determined from the reference signal via a phase-locked-loop.

According to another aspect, a trigger condition is applied to at least one of the time and amplitude discrete representation of the input signal and the time discrete representation of the phase of the reference signal.

In another embodiment, the method further comprises the step of detecting whether a momentary pair of values lies within a predetermined value range, the pair of values being defined by a value of the time and amplitude discrete representation of the input signal and an assigned value of the time discrete representation of the phase of the reference signal.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
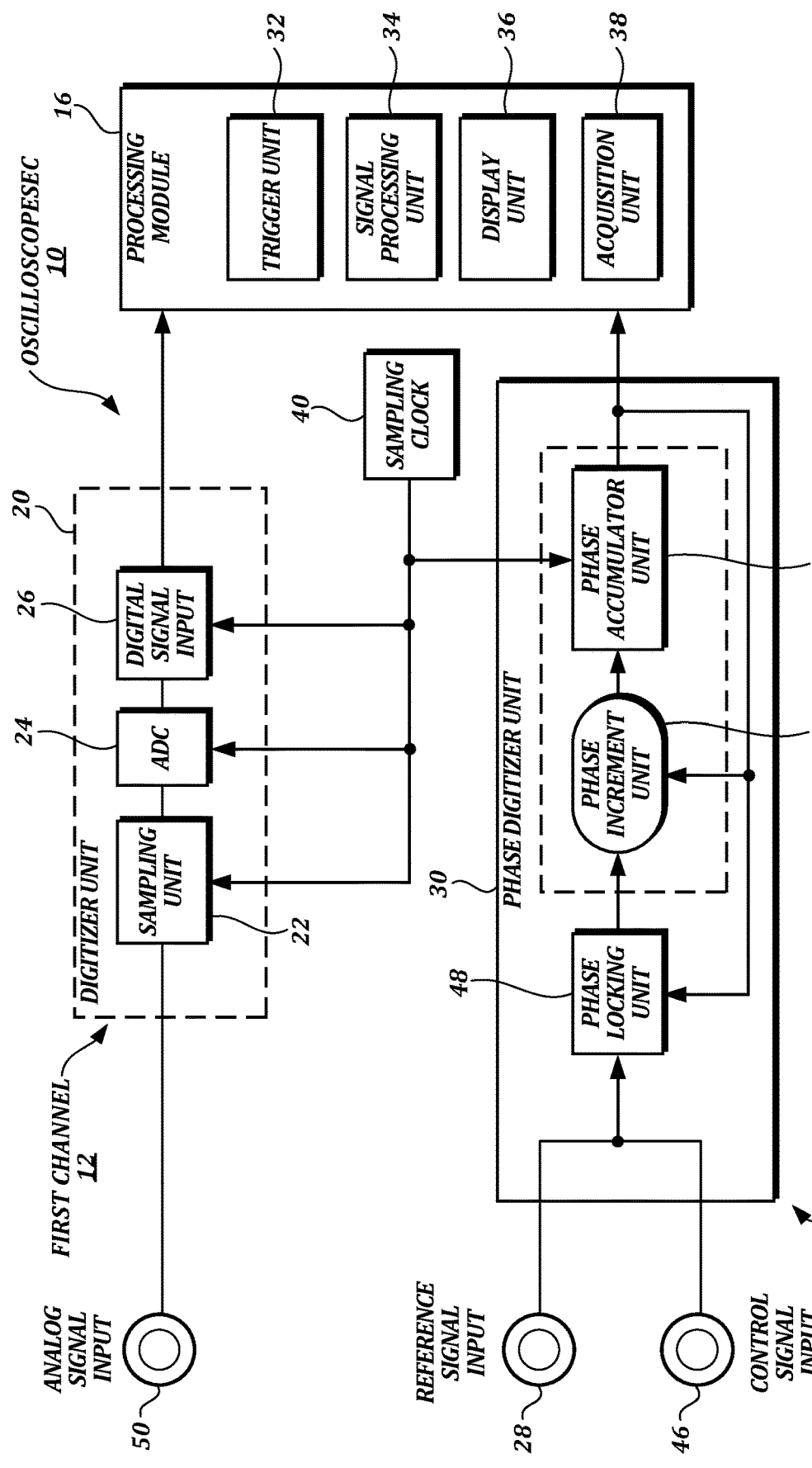
FIG. 1 shows a schematic view of one representative embodiment of an oscilloscope according to the disclosure.

In FIG. 1, an oscilloscope 10 is shown. The oscilloscope 10 comprises a first channel 12 and a second channel 14 as well as a processing module 16. Both the first and the second channel 12, 14 are connected with the processing module 16 in a signal transmitting manner.

In the embodiment shown, the first channel 12 comprises an analog signal input 18 and a digitizer unit 20, the digitizer unit 20 being configured to receive an analog input signal and to provide a time and amplitude discrete representation of the analog input signal to the processing module 16. The digitizer unit 20 is configured to digitize the analog input signal to generate the time and amplitude discrete representation of the analog input signal. The digitizer unit 20 may comprise at least one of a sampling unit 22, an analog-to-digital-converter 24 and a digital signal processing unit 26.

The oscilloscope 10 may comprise several channels similar to the first channel 12, for example, several analog input channels.

The second channel 14 comprises a reference signal input 28 and a phase digitizer unit 30, the phase digitizer unit 30 being configured to receive a reference signal and to provide a time discrete representation of the phase of the reference signal to the processing module 16, which will be described in more detail below.

The processing module 16 may comprise at least one of a trigger unit 32, a signal processing unit 34, a display unit 36 and an acquisition unit 38.

Moreover, a sampling clock unit 40 being configured to generate a sampling clock signal may be provided. The sampling clock unit 40 is connected to at least one of the first and the second channel 12, 14 in a signal transmitting manner.

Figure 2:
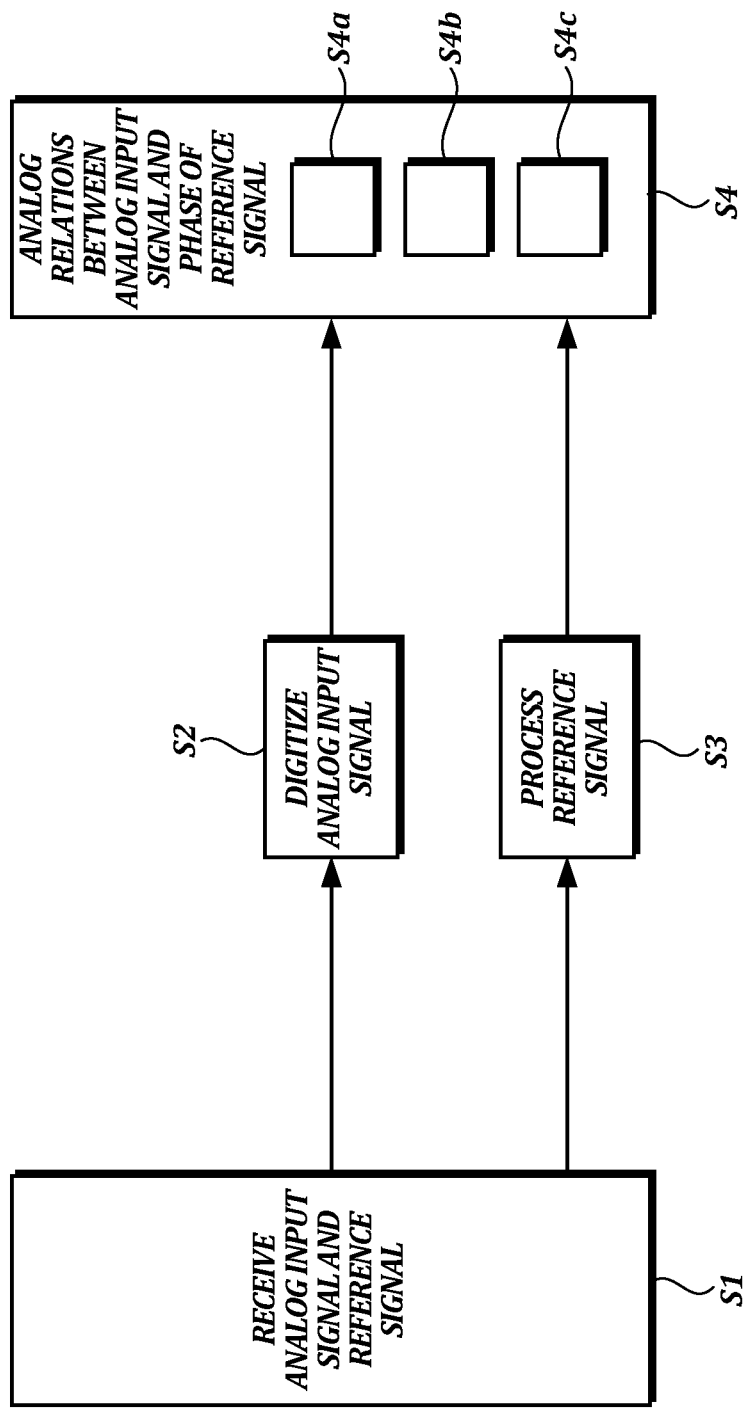
FIG. 2 shows a schematic flow chart of one representative embodiment of a method according to the disclosure.

A method for operating the oscilloscope 10 will be described in the following with reference to the schematic flow chart of the method depicted in FIG. 2. First, an analog input signal and a reference signal are received by the digitizer unit 20 and the phase digitizer unit 30, respectively (step S1). The reference signal is a periodic signal. It may be at least one of the analog input signal, a mixed channel signal, an external trigger input signal, a logic analyzer input signal, the sampling clock signal and a recovered clock from a serial data stream fed into the first channel 12.

Then, the received analog input signal is digitized (e.g., via at least one of the sampling unit 22 and the analog-to-digital converter 24) to provide the time and amplitude discrete representation of the analog input signal (step S2). Moreover, the reference signal is processed by the phase digitizer unit 30 (which also could be referred to as digital oscillator) to provide the time discrete representation of the phase of the reference signal (step S3). This step will be described in some more detail in the following.

The phase digitizer unit 30 provides a time discrete phase of a periodic clock signal (i.e. the time discrete representation of the phase of the reference signal) to the processing module 16 instead of the periodic clock signal itself.

The phase digitizer unit 30 may comprise a phase accumulator unit 42 and a phase increment unit 44. The phase increment unit 44 adds a phase increment to the time discrete representation of the reference signal (stored in the phase accumulator unit 42) in several cycles of the reference signal, for example, in every cycle, which is subsequently provided to the processing module 16.

The phase increment added may be constant. Alternatively, it may be varied by the phase increment unit 44 based on the frequency of the reference signal. Put another way, the phase increment 44 is varied to provide a time discrete phase of a periodic clock having a desired frequency. For example, the frequency of the reference signal may be multiplied by a constant factor to generate the desired frequency of the periodic clock.

In another variant, the frequency of the time discrete representation of the phase of the reference signal may be adjusted to match the frequency of a control signal received by the phase digitizer unit 30 via an control signal input 46. The control signal input 46 may be separate from or identical to the reference signal input 28.

The control signal may be received via a phase locking unit 48 which is configured to adjust the phase increment based on the control signal, in particular via a phase-locked loop (PLL).

The control signal may be at least one of the analog input signal, a mixed channel signal, an external trigger signal and a line trigger reference signal.

The time and amplitude discrete representation of the analog input signal as well as the time discrete representation of the phase of the reference signal is provided to the processing module 16.

Now, relations between the time and amplitude discrete representation of the analog input signal and the time discrete representation of the phase of the reference signal are analyzed by the processing module 16 (step S4). The term "are analyzed" in step S4 represents several possible steps, wherein at least one of these steps is performed. The several possible steps are explained in more detail below.

A trigger signal may be generated by the trigger unit 32 (step S4a). The trigger signal may be generated based on at least one of a first trigger condition applied to the time and amplitude discrete representation of the input signal and a second trigger condition applied to the time discrete representation of the phase of the reference signal.

The processing module 16 may detect whether a momentary pair of values lies within a predetermined value range (step S4b). The momentary pair of values comprises a value of the time and amplitude discrete representation of the input signal and an assigned value of the time discrete representation of the reference signal.

The predetermined value range is a two-dimensional manifold (sometimes also referred to as "eye" of an eye diagram) in a plane where one axis represents the phase of the reference signal and another axis represents an amplitude of the analog input signal. The manifold may have any shape, e.g. the shape of a slotted rectangle, a slotted ellipse or an annulus. However, deformations of these shapes are also possible.

The momentary pair of values lying outside of the predetermined value range (which will in the following be referred to as eye diagram violation) could also be used as a trigger condition for step S4a.

Figure 3:
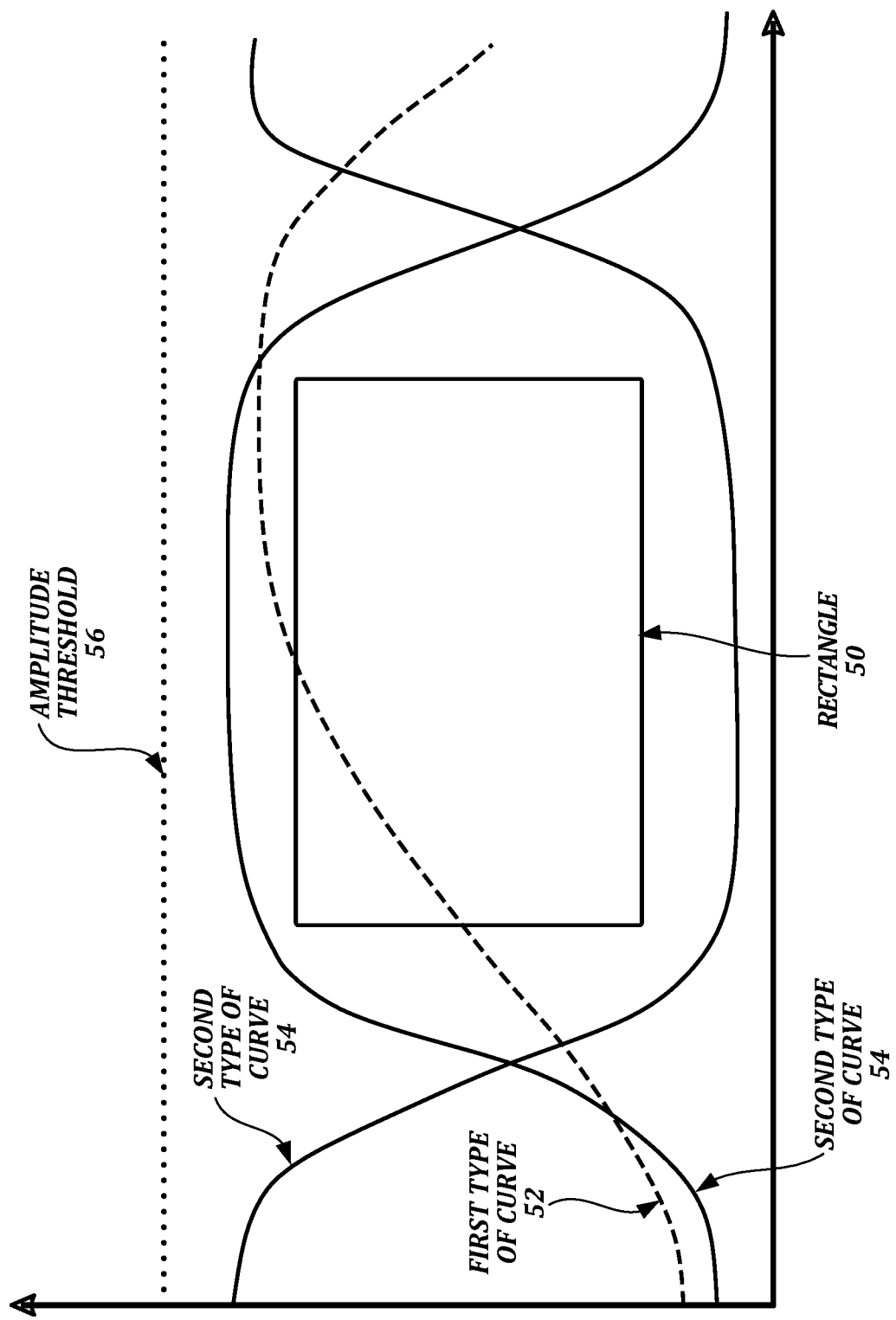
FIG. 3 shows an exemplary eye diagram obtained via a method according to the disclosure.

FIG. 3 depicts an exemplary plot of the amplitude A of the analog input signal against the phase $\phi$ of the reference signal. In the variant shown, the predetermined value range is the exterior of a rectangle 50. Moreover, two types of curves 52, 54 are depicted.

The first type of curve 52 extends into an area inside of the rectangle 50 and therefore an eye diagram violation is detected (which may be used as a trigger condition). There may be additional trigger conditions, such as an amplitude threshold trigger condition represented by the dashed line 56 in FIG. 3.

The second type of curve 54 remains outside of the rectangle 50 and therefore no eye diagram violation is detected for this type of curve.

According to the present disclosure, eye diagram violations are observed hardware-based and on-the-fly, i.e. without software-based post-processing.

In step S4b, a statistical frequency of eye diagram violations may be determined. Put another way, a number of times the momentary pair of values lies outside of the predetermined value range may be counted. The statistical frequency of eye diagram violations may be outputted to further components of the oscilloscope 10, e.g. a memory unit or the display unit 36, where the statistical frequency may be displayed as a bit error rate (BER).

The statistical frequency may be determined between at least one of two predetermined portions of the time discrete representation of the phase of the reference signal and two predetermined portions of the time and amplitude discrete representation of the input signal. The predetermined portions may be defined by certain trigger conditions imposed on at least one of the time discrete representation of the phase of the reference signal and the time amplitude discrete representation of the input signal.

In some embodiments, a statistical frequency of eye diagram violations within a certain phase interval is determined.

In another variant, pairs of values may be displayed via the display unit 36 (step S4c), the pairs of values each being defined by a value of the time and amplitude discrete representation of the input signal and an assigned value of the time discrete representation of the reference signal. For example, a histogram of these signals may be displayed. In other words, the time and amplitude discrete representation of the input signal is plotted against the time discrete representation of the phase of the reference signal. In some embodiments, the resulting plot is an eye diagram such as depicted exemplarily in FIG. 3.

It will be appreciated that several components, including but not limited to the processing module, the digitizer unit, the phase digitizer unit, etc., have been described herein as "processing" signals or that various signals are being "analyzed" by such components. This analysis or processing can be carried out in embodiments of the present disclosure by analog circuitry, digital circuitry, or a combination of analog and digital circuitry, and can include discrete digital or analog circuit elements or electronics, or combinations thereof. Such circuitry is configured and arranged in order to implement the technologies and methodologies set forth herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An oscilloscope comprising:
    a processing circuit and at least a first channel and a second channel,
    the first channel comprising a digitizer, the digitizer being configured to receive an analog input signal and to provide a time and amplitude discrete representation of the input signal to the processing circuit;
    the second channel comprising a phase digitizer, the phase digitizer being configured to receive a reference signal and to provide a time discrete representation of the phase of the reference signal to the processing circuit; and
    the processing circuit being configured to process both the time and amplitude discrete representation of the input signal and the time discrete representation of the phase of the reference signal, wherein the processing circuit comprises a trigger configured to generate a trigger signal based on a trigger condition applied to the time discrete representation of the phase of the reference signal, wherein the trigger is configured to detect certain events defined by a momentary value of the time discrete representation of the phase of the reference signal, and wherein at least one of the certain events is associated with a momentary pair of values lying outside or inside of a predetermined value range, the pair of values being defined by a value of the time and amplitude discrete representation of the input signal and an assigned value of the time discrete representation of the phase of the reference signal.

2. The oscilloscope according to claim 1, wherein the processing circuit is configured to analyze relations between the time and amplitude discrete representation of the input signal and the time discrete representation of the phase of the reference signal.

3. The oscilloscope according to claim 1, wherein the processing circuit comprises a trigger being configured to generate a trigger signal based a further trigger condition applied to the time and amplitude discrete representation of the input signal.

4. The oscilloscope according to claim 1, wherein the processing circuit is configured to detect whether a momentary pair of values lies within a predetermined value range, the pair of values being defined by a value of the time and amplitude discrete representation of the input signal and an assigned value of the time discrete representation of the phase of the reference signal.

5. The oscilloscope according to claim 4, wherein the processing circuit is configured to determine a statistical frequency that the momentary pair of values lies within the predetermined value range or not.

6. The oscilloscope according to claim 5, wherein the processing circuit is configured to determine said statistical frequency between at least one of two predetermined portions of the time discrete representation of the phase of the reference signal and two predetermined portions of the time and amplitude discrete representation of the input signal.

7. The oscilloscope according to claim 1, wherein the processing circuit comprises a display unit being configured to display pairs of values being defined by a value of the time and amplitude discrete representation of the input signal and an assigned value of the time discrete representation of the phase of the reference signal.

8. The oscilloscope according to claim 1, wherein the phase digitizer comprises a phase accumulator being configured to provide the time discrete representation of the phase of the reference signal.

9. The oscilloscope according to claim 1, wherein the phase digitizer comprises a phase incrementor being configured to add a phase increment to the reference signal.

10. The oscilloscope according to claim 9, wherein the phase incrementor is configured to add the phase increment at several cycles of the reference signal.

11. The oscilloscope according to claim 9, wherein the phase incrementor is configured to vary the phase increment.

12. The oscilloscope according to claim 9, wherein the phase digitizer further comprises a phase locking unit being configured to adjust the phase increment based on a control signal.

13. The oscilloscope according to claim 12, wherein the control signal is provided by at least one of an analog input channel, a mixed signal channel, an external trigger input or a line trigger reference.

14. The oscilloscope according to claim 1, wherein the reference signal comprises at least one of an analog input signal, an external trigger input, a logic analyzer input, a sampling clock signal or a recovered clock signal from a serial data stream.

15. A method for operating an oscilloscope, comprising the steps of:
   receiving an analog input signal and a reference signal;
   digitizing the analog input signal to provide a time and amplitude discrete representation of the input signal;
   processing the reference signal to provide a time discrete representation of the phase of the reference signal; and
   analyzing relations between the time and amplitude discrete representation of the input signal and the time discrete representation of the phase of the reference signal,
   wherein the time and amplitude discrete representation of the input signal is provided in parallel to the time discrete representation of the phase of the reference signal, wherein the time and amplitude discrete representation of the input signal is provided only to a first channel, and wherein the time discrete representation of the phase of the reference signal is provided only to a second channel,
   wherein a trigger condition is applied to at least one of the time and amplitude discrete representation of the input signal and the time discrete representation of the phase of the reference signal, and
   wherein the trigger condition is associated with a momentary pair of values lying outside or inside of a predetermined value range, the pair of values being defined by a value of the time and amplitude discrete representation of the input signal and an assigned value of the time discrete representation of the phase of the reference signal.

16. The method according to claim 15, wherein the analyzing of the time discrete representation of the phase of the reference signal and the time and amplitude discrete representation of the input signal is carried out in hardware.

17. The method according to claim 15, wherein a phase increment is added to the time discrete representation of the phase of the reference signal in several cycles of the reference signal.

18. The method according to claim 17, wherein the phase increment is determined from the reference signal via a phase locked loop.

19. The method of claim 15, further comprising the step of detecting whether a momentary pair of values lies within a predetermined value range, the pair of values being defined by a value of the time and amplitude discrete representation of the input signal and an assigned value of the time discrete representation of the phase of the reference signal.

20. An oscilloscope comprising:
   a processing circuit and at least a first channel and a second channel,
   the first channel comprising a digitizer configured to receive an analog input signal and to provide a time and amplitude discrete representation of the input signal to the processing circuit;
   the second channel comprising a phase digitizer configured to receive a reference signal and to provide a time discrete representation of the phase of the reference signal to the processing circuit; and
   the processing circuit being configured to process both the time and amplitude discrete representation of the input signal and the time discrete representation of the phase of the reference signal,
   wherein the time and amplitude discrete representation of the input signal is provided only to the first channel, and wherein the time discrete representation of the phase of the reference signal is provided only to the second channel,
   wherein the processing circuit is configured to detect whether a momentary pair of values lies within a predetermined value range, the pair of values being defined by a value of the time and amplitude discrete representation of the input signal and an assigned value of the time discrete representation of the phase of the reference signal, and
   wherein the predetermined value range is a two-dimensional manifold in a plane where one axis represents the phase of the reference signal and another axis represents an amplitude of the analog input signal.

* * * * *